DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED AUGUST 31, 1971

889 O.G. 1368

T889,027
LITHOGRAPHIC PRINTING PLATE
Gale F. Nadeau, Jr., 1669 Lake Ave.,
Rochester, N.Y. 14650
Filed Nov. 20, 1970, Ser. No. 91,603
Int. Cl. G03f *7/02*
U.S. Cl. 96—33
No Drawing. 8 Pages Specification

Photographic supports such as anodized aluminum and polyethylene coated paper are coated with a mixture of a maleic anhydride copolymer and an epoxy compound followed by heating to yield a hydrophobic surface useful for coating with sensitive layers such as silver halide emulsion layers or light-sensitive polymer layers. The products can, for example, be used for the production of lithographic printing plates by forming resist images on the polymeric surfaces and hydrolyzing the non-printing areas with alkaline solution. Alternately, the hydrophobic surface can be treated locally imagewise with alkaline solution to obtain a planographic printing plate.